United States Patent [19]
Anderson

[11] Patent Number: 6,099,648
[45] Date of Patent: Aug. 8, 2000

[54] DOMED WAFER REACTOR VESSEL WINDOW WITH REDUCED STRESS AT ATMOSPHERIC AND ABOVE ATMOSPHERIC PRESSURES

[75] Inventor: Roger N. Anderson, San Jose, Calif.

[73] Assignee: Applied Materials, Inc., Santa Clara, Calif.

[21] Appl. No.: 08/907,171

[22] Filed: Aug. 6, 1997

[51] Int. Cl.$^7$ .................................................. C23C 16/00
[52] U.S. Cl. ........................ 118/715; 118/724; 118/729; 118/730; 118/733; 392/416; 392/418
[58] Field of Search .................................. 118/715, 724, 118/729, 730, 733; 392/416, 418

[56] References Cited

U.S. PATENT DOCUMENTS

| | | | |
|---|---|---|---|
| 4,920,918 | 5/1990 | Adams et al. | 118/724 |
| 5,085,887 | 2/1992 | Adams et al. | 427/55 |
| 5,108,792 | 4/1992 | Anderson et al. | 427/248 |
| 5,194,401 | 3/1993 | Adams et al. | 437/173 |
| 5,234,526 | 8/1993 | Chen et al. | 156/345 |
| 5,587,019 | 12/1996 | Fujie . | |

FOREIGN PATENT DOCUMENTS

| | | |
|---|---|---|
| 393809 | 1/1990 | European Pat. Off. . |
| 474251A1 | 6/1991 | European Pat. Off. . |

OTHER PUBLICATIONS

Single Wafer RTP–CVD Epitaxial Deposition Technology, Fred Wong p. 53–54 400 Solid State Technology 32 (1989) Oct., No. 10, Tulsa, OK, US.

*Primary Examiner*—Shrive Beck
*Assistant Examiner*—Norca L. Torres
*Attorney, Agent, or Firm*—Blakely Sokoloff Taylor & Zafman

[57] ABSTRACT

A thermal reactor having a wafer chamber for containing at least one semiconductor wafer during processing. The thermal reactor contains a quartz window having an inward bow defining a concave outside surface.

16 Claims, 6 Drawing Sheets

DOMED WAFER REACTOR VESSEL WINDOW WITH REDUCED STRESS AT ATMOSPHERIC AND ABOVE ATMOSPHERIC PRESSURES

FIELD OF THE INVENTION

The present invention relates to thermal reactors for processing semiconductor wafers, and more particularly to a reactor having a domed window with reduced stress at atmospheric and above atmospheric pressure processes.

BACKGROUND OF THE INVENTION

Recent technological progress is closely identified with the increasing miniaturization of electronic circuits made possible by advances in semiconductor processing. Certain advanced processing techniques require exposing a semiconductor structure to a reactant gas under carefully controlled conditions. Examples of such processes include chemical vapor deposition and etching processes. Of particular concern is the uniformity of temperature and gas flow to ensure uniform results, e.g., deposition thickness, across a wafer.

The process of depositing layers on a semiconductor wafer (or substrate) usually involves placing the substrate within a thermal reactor chamber and holding the wafer within a stream of a reactant gas flowing across the surface of a wafer. The thermal reactor is heated by external lamps which pass infra-red radiation into the reactor chamber through heating ports. The heating ports are covered by quartz windows that are transparent to the infra-red radiation.

Prior art deposition processes involve the deposition of a reactant gas at ambient and subambient pressures. FIG. 1 illustrates a cross-sectional view of a thermal reactor 100 used for reduced pressure operations. Reactor 100 includes a chamber 102 for facilitating the flow of a process gas over the surface of a wafer. The housing includes a baseplate 104 having a gas inlet port 106 and a gas exhaust port 108. An upper clamp ring 110 and a lower clamp ring 112 act to hold a quartz cover member 114 and a quartz lower member 116 in place, respectively. Cover member 114 generally includes a flange portion 118 and a central window portion 120. Flange portion 118 is resiliently supported between baseplate 104 and clamp ring 110 by resilient o-rings 122. Process gas is injected into chamber 102 through gas inlet port 106 which is connected to a gas source. Residual process gas and various waste products are continuously removed from the interior of chamber 102 through exhaust port 108. A susceptor 124 holds the wafer in position during the semiconductor/layer deposition process. A susceptor support shaft 126 is coupled to susceptor 124 for positioning and rotating the wafer during the semiconductor fabrication process. Quartz central window portion 120 has an outward bow that forms a convex outside surface. The outward bow is curved enough to oppose the compressive force of the ambient pressure against the reduced internal pressure of chamber 102 during wafer processing. Heating lamps 128 and 130 provide infra-red radiant heat into the chamber through window portion 120 and quartz lower member 116 which are transparent to infra-red radiation.

Wafer processing at ambient pressure is often desired because the deposition rate of the process gas is higher at ambient pressure than it is at a reduced pressure. Ambient pressure processing also allows the use of certain chemical species, for example, trichlorosilane, which has an undesirable effect of coating the chamber walls at reduced pressures.

FIG. 2 illustrates a cross-sectional view of an ambient pressure thermal reactor 200. As shown in FIG. 2, reactor 200 contains a flat quartz window 202 in lieu of the outwardly bowed window of the subambient pressure reactor of FIG. 1. Although the flat window provides a uniform reactant gas flow across the surface of the wafer, it cannot be used in processing applications wherein a differential pressure exists across the surface of the window. When subjected to chamber over pressure or under pressure situations the differential pressure across the flat window causes localized stresses to occur that subject the window to breakage. Another problem associated with the flat window design is that high internal tensile stresses resulting from temperature gradients within the window may result in breakage.

One way to overcome these problems is to increase the wall thickness of the window. However, this produces an undesirable result in that the interior surface temperature of the quartz increases as the wall thickness increases. This increase in temperature can lead to deposition on the interior surface of the quartz window, which, in turn, reduces the radiant heat transfer through the window.

SUMMARY OF THE INVENTION

A thermal reactor for processing a semiconductor wafer is disclosed. The thermal reactor vessel contains a cover member having a central quartz window portion having an inward bow defining a concave outside surface. The unique shape of the quartz window permits the operating pressure of the thermal reactor chamber to be maintained at a pressure greater than atmospheric pressure. The positive chamber pressure reduces the stress level in the heated cover member by compensating for the stress produced by the thermal expansion produced during heating of the thermal reactor. Thus, in accordance with the present invention the deposition of a layer onto the surface of a wafer may be achieved by mounting the wafer on a susceptor within the chamber and pressurizing the chamber above atmospheric pressure with a processing reactant gas. Once the chamber is pressurized, the wafer is heated by radiating heat through the quartz central window portion and a reactant gas is introduced into chamber to flow over the wafer.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A quartz window for a thermal reactor is disclosed. In the following description, numerous specific details are set forth, such as material types, dimensions, etc., in order to provide a thorough understanding of the present invention. However, it will be obvious to one of ordinary skill in the art that the invention may be practiced without these specific details. In other instances, well-known structures and processing steps have not been shown in particular detail in order to avoid unnecessarily obscuring the present invention.

Figure 3:
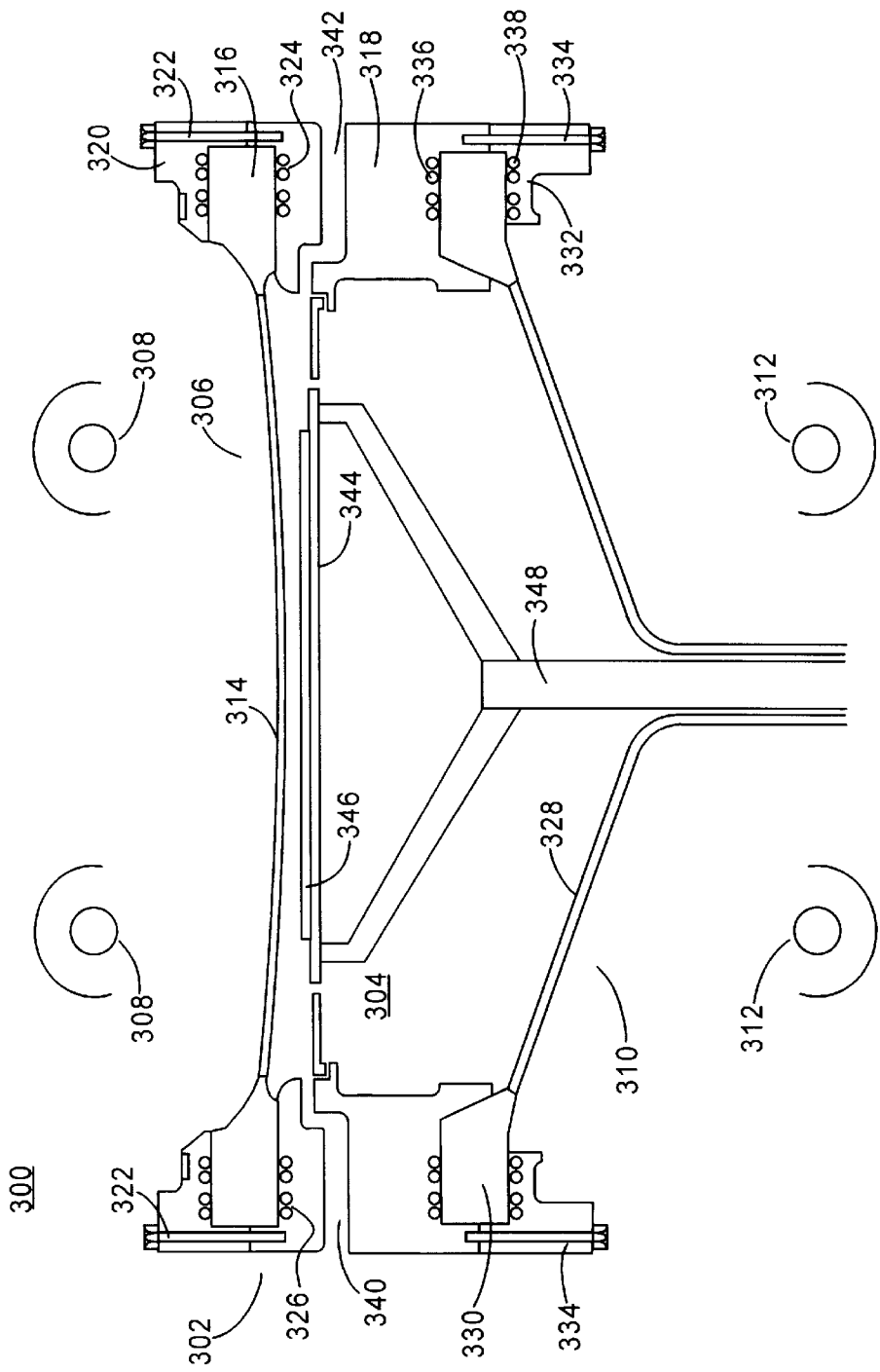
FIG. 3 illustrates a cross-sectional view of a thermal reactor in accordance with one embodiment of the present invention.

With reference to FIG. 3, a thermal reactor in accordance with one embodiment of the present invention is illustrated. Thermal reactor 300 is formed by a reactor vessel 302 defining a wafer reactor chamber 304. Chamber 302 is defined, in part, by a cover member 306 mounted below an upper heating source 308, and a lower member 310 mounted above a lower heating source 312. Cover member 306 and lower member 310 are generally made of quartz. Heating sources 308 and 312 provide infra-red radiant heat into the chamber through members 306 and 310 which are transparent to infra-red radiation. The wafer cover member 306 includes a central window portion 314 and a peripheral flange portion 316 for supporting the central window portion. Central window portion 314 is typically made of a clear fused silica quartz whereas the flange portion is made of an opaque quartz. The flange is captured between a baseplate 318 and an upper clamp ring 320. Clamp ring 320 is secured to baseplate 318 by a suitable clamping means such as locking bolts 322. It is appreciated that cover member 306 may be made entirely of a single material, such as fused silica quartz. Moreover, it is to be understood that the present invention is not limited to the manner in which the cover member is attached to the reactor housing.

Cover member 306 is resiliently supported by a cushioning material such as base sealing rings 324 that are positioned between baseplate 318 and flange 316. Cover member 306 is further supported by clamp sealing o-rings 326 that are located between clamp ring 320 and flange 316. The o-rings are preloaded by the locking bolts 322 to provide a double seal for preventing the processing gas within chamber 304 from escaping into the ambient atmosphere. Lower member 310 also has a window portion 328 and a flange portion 330 that is similarly mounted between baseplate 318 and a lower clamp ring 332 with locking bolts 334 and o-rings 336 and 338.

Process gas enters chamber 304 through a gas inlet port 340 and exits the chamber through an exit port 342. The pressure of the gas within the chamber is maintained by metering the gas flow out of exit port 342.

A susceptor 344 is provided within chamber 304 for supporting a wafer 346. Susceptor 344 includes a mounting shaft 348 that is coupled to a motor (not shown). In this manner, wafer 348 may be rotated during processing to permit a more uniform heating and deposition.

As previously discussed, wafer processing at ambient pressure is often desired because the deposition rate of the process gas is higher at ambient pressure than it is at a reduced pressure. However, a problem associated with existing ambient pressure thermal reactors is that the flat window used in such reactors is susceptible to breakage when a chamber over pressure or under pressure situation occurs. The quartz material of window portion 314 is generally transparent to the direct radiation from the infra-red heat lamps that pass through the window into the chamber without significant absorption. However, some of the lower frequency energy re-radiated from the heated wafer and susceptor pass into the window quartz with significant absorption by the window material. These re-radiations generate heat within the window producing thermal expansion forces. The flat window of prior art thermal reactors are susceptible to breakage from the high internal tensile stresses that occur due to the thermal expansion of the window. As a result, the flat window is vulnerable to breakage particularly at points along the outer edge of the flange portion where a nick or chip may exist.

A salient feature of the present invention lies in the construction of cover member 306. In accordance with the present invention, the window portion 314 of cover member 306 has a slight inward bow forming a slightly concave outside surface. The inward bow configuration causes the stress within central window portion 314 to be transmitted into the flange portion 316. The flange portion thus acts to resist the outward expansion of the domed cover member 306 due to a pressure differential across the cover and/or the thermal expansion due to heating of central window portion 314. The inward bow configuration of the window more nearly approximates the flat window of conventional ambient pressure thermal reactors, thus resulting in a more desirable flow cross-section for the process gas.

Figure 1:
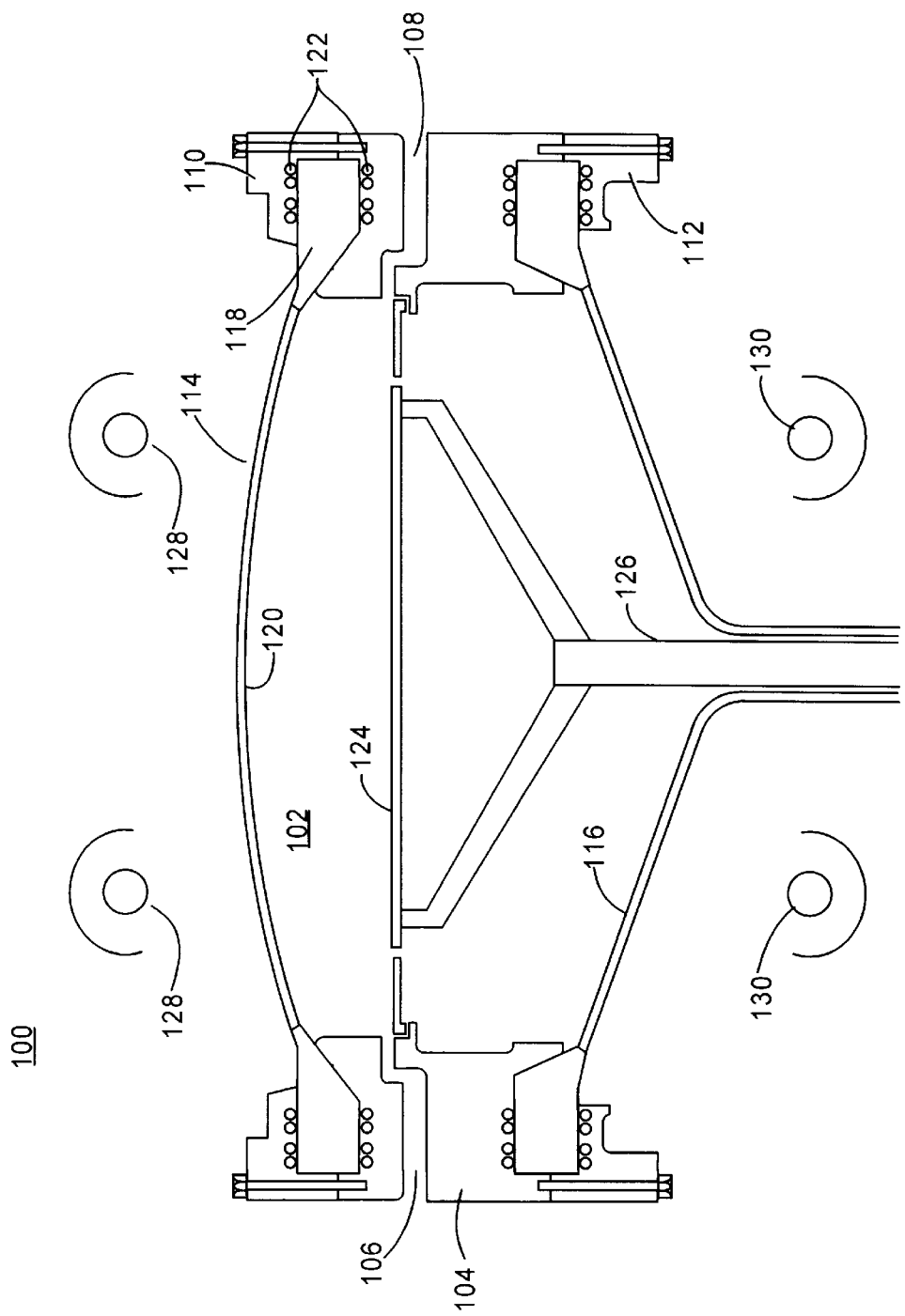
FIG. 1 illustrates a typical cross-sectional view of a prior art subambient pressure thermal reactor.
Figure 2:
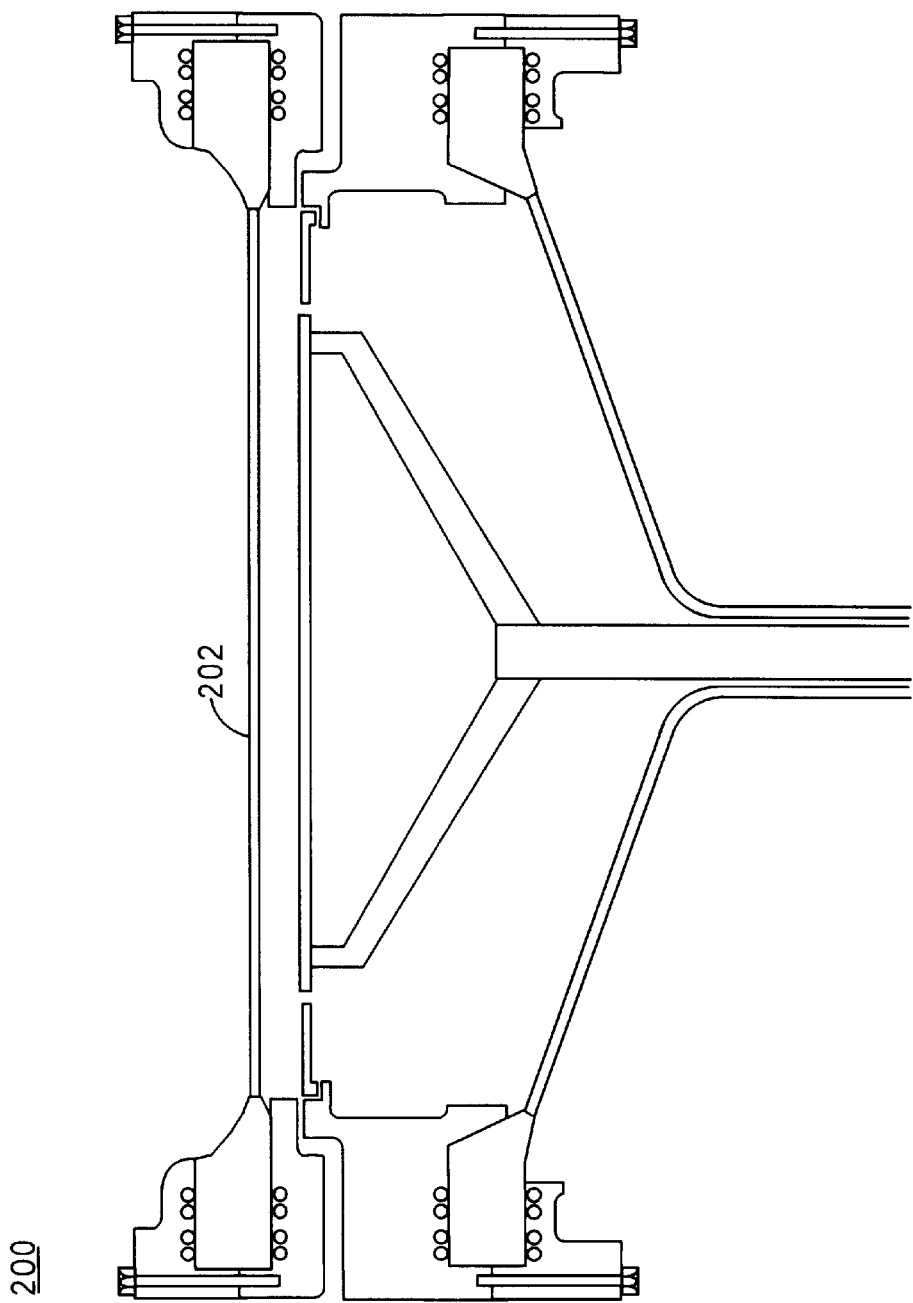
FIG. 2 illustrates a typical cross-sectional view of a prior art ambient pressure thermal reactor.

The diameter of window portion 314 may vary significantly from one thermal reactor to another. In one exemplary embodiment window portion 314 has a diameter of 17.5 inches. The radius of curvature of central window portion 314 is relatively large; typically 3 to 10 times that of the subambient pressure domed window of FIG. 1. In one embodiment, window portion 314 has a radius of curvature of 100 inches. Depending upon the specific application, the radius of curvature typically is in the range of 50 to 300 inches. The thickness of central window portion 314 is generally between of 0.1 to 0.2 inches. The thickness of flange portion 316 is in the range of 0.75 to 1.5 inches.

Figure 4:
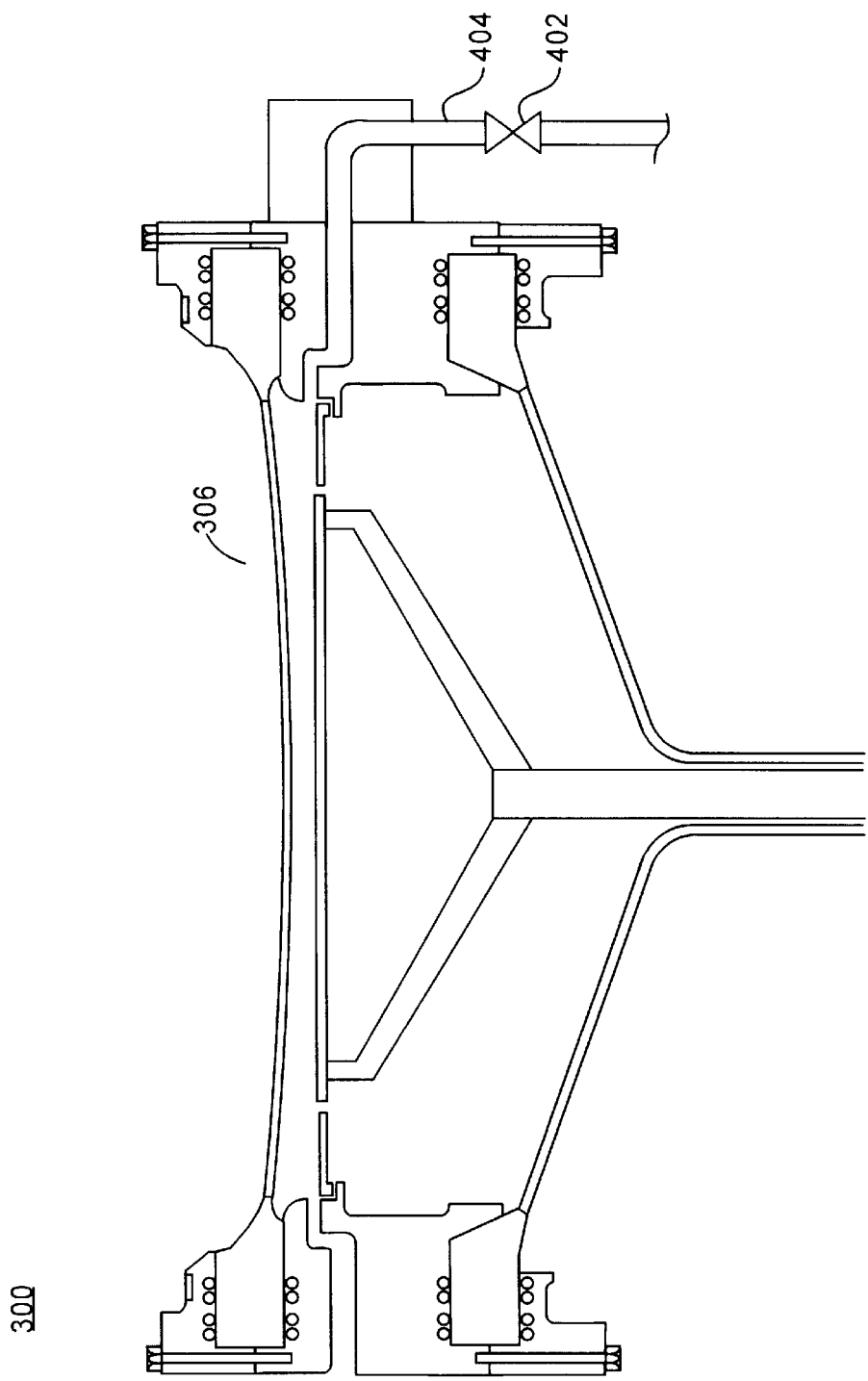
FIG. 4 illustrates a cross-sectional view of a thermal reactor in accordance with another embodiment of the present invention.
Figure 5:
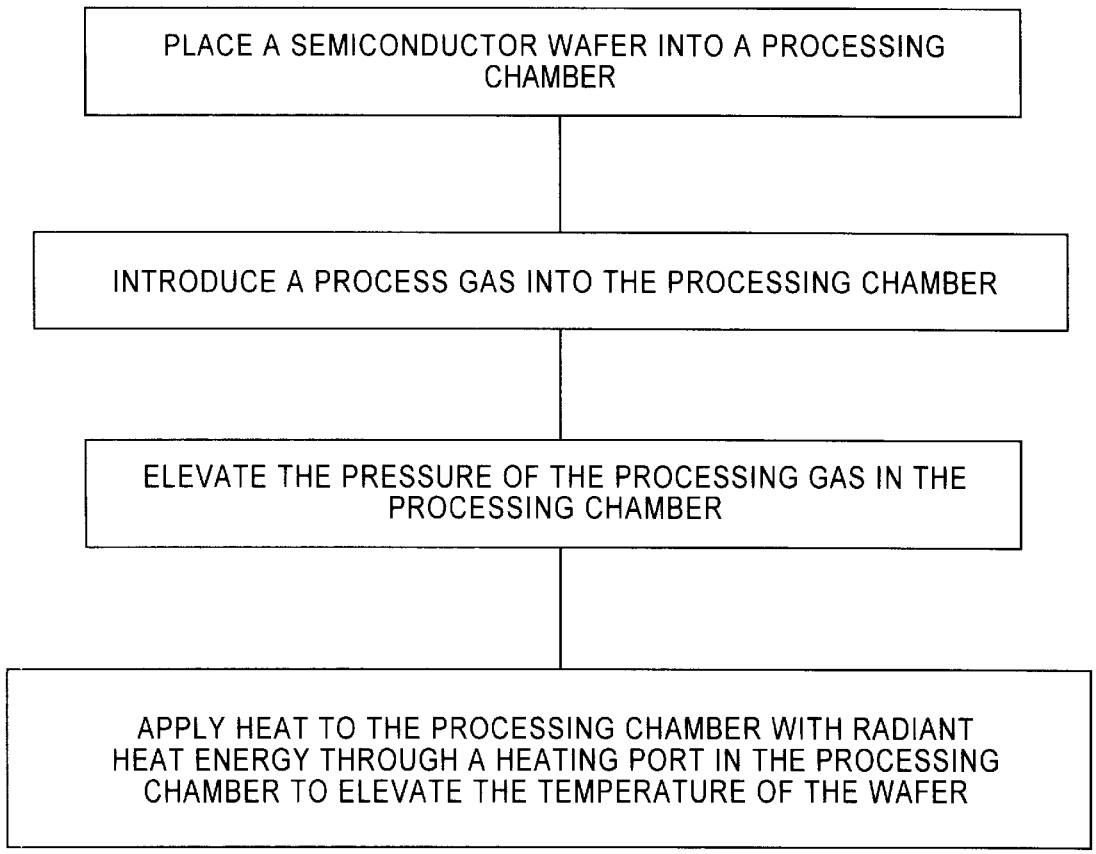
FIG. 5 is a flow diagram of method for processing a semiconductor wafer in accordance with the present invention.

The operating strength of quartz is in the range of 5,000 to 14,000 pounds per square inch (p.s.i.). It is desirable to limit the internal tensile stress of the quartz window to 2,000 p.s.i. in order to provide a safety factor for variations in material quality. The unique shape of cover member 306 permits the operating pressure of chamber 304 to be maintained at a pressure slightly greater than atmospheric pressure. The positive chamber pressure actually reduces the stress level in the heated cover member 306 by compensates for the stress produced by the thermal expansion produced during heating. Thus, in accordance with the present invention the deposition of a layer onto the surface of a wafer 346 may be achieved by mounting the wafer on susceptor 344 and pressurizing the chamber above atmospheric pressure with a processing reactant gas. In one embodiment the chamber pressure is maintained at approximately 3 p.s.i.g. It is to be understood, however, that the present invention is not limited to any one elevated chamber operating pressure. The chamber operating pressure will generally range from 1 to 10 p.s.i.g. Pressurization of chamber 304 is achieved by restricting the flow of gas exiting the chamber. The gas used to initially pressurize chamber 304 may be a non-reactive gas, such as helium, or may comprise the processing reactant gas. The reactant gas may comprise any of a number of gases, such as, for example, hydrogen or a hydrogen/deposition species mixture. The deposition species may include trichlorosilane, dichlorosilane, silane, or any of a variety of dopant species. As shown in FIG. 4, a throttle valve 402 may be positioned in the processing gas exhaust piping 404 to restrict the flow of gas. An orifice, or other restricting means may also be used to restrict the flow of gas in order to create a back pressure to pressurize chamber 304. Once the chamber is pressurized, wafer 346 is heated by radiating heat through central window portion 314, and a reactant gas is introduced into chamber 304 to flow over wafer 346. FIG. 5 is a flow diagram of the process. In an alternative embodiment, the chamber pressure is pressurized and heated simultaneously.

By operating the thermal reactor at a positive pressure higher growth rates are achieved due to the greater gas density in the chamber. An additional benefit of operating the thermal reactor at a positive pressure is that the chamber pressure can be controlled to a predetermined value which improves process repeatability and uniformity. In addition, by operating at a positive pressure, the thermal reactor chamber can be leak checked more accurately than an ambient pressure thermal reactor.

It is important to note that the present invention is not limited to applications wherein a positive pressure is established and maintained within the processing chamber. The thermal reactor of the present invention may also be used for ambient pressure processing. During ambient pressure processing, the inward bow of the chamber window acts to inhibit cracking or breaking of the window during over pressure situations.

Figure 6:
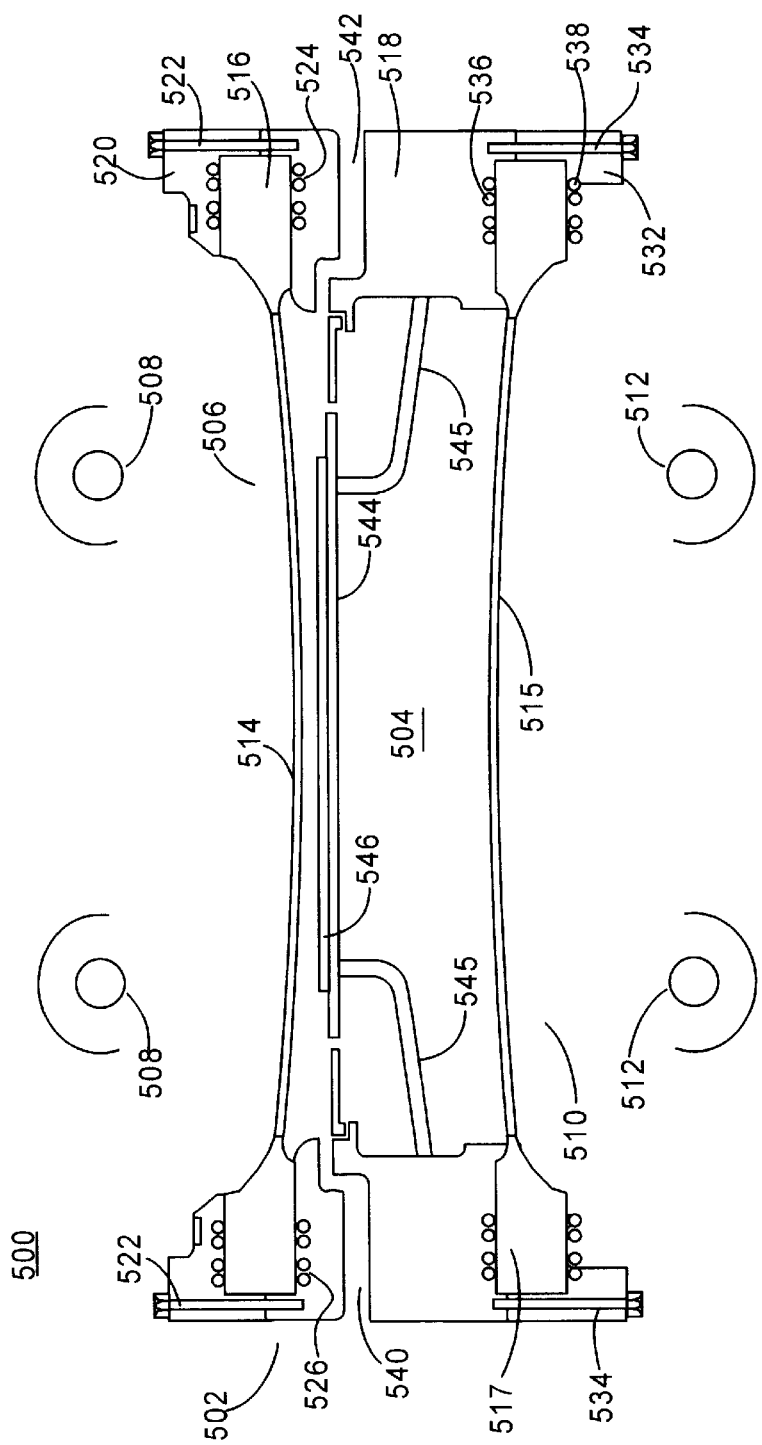
FIG. 6 illustrates a cross-sectional view of a thermal reactor in accordance with yet another embodiment of the present invention.

FIG. 6 illustrates a thermal reactor 500 in another embodiment of the invention. Thermal reactor 500 is formed by a reactor vessel 502 defining a wafer reactor chamber 504. Chamber 502 is defined, in part, by an upper cover member 506 mounted below an upper heating source 508, and a lower cover member 510 mounted above a lower heating source 512. Cover members 506 and 510 are generally made of quartz. Heating sources 508 and 512 provide infra-red radiant heat into the chamber through members 506 and 510 which are transparent to infra-red radiation. Each of cover members 506 and 510 includes a central window portion 514 and 515 and a peripheral flange portion 516 and 517, respectively. Central window portions 514 and 515 are typically made of a clear fused silica quartz whereas the flange portions 516 and 517 are made of an opaque quartz. Upper flange portion 516 is captured between a baseplate 518 and an upper clamp ring 520. Clamp ring 520 is secured to baseplate 518 by a suitable clamping means such as locking bolts 522. Upper cover member 506 is resiliently supported by a cushioning material such as base sealing rings 524 that are positioned between baseplate 518 and flange 516. Cover member 506 is further supported by clamp sealing o-rings 526 that are located between clamp ring 520 and flange 516. The o-rings are preloaded by the locking bolts 522 to provide a double seal for preventing the processing gas within chamber 504 from escaping into the ambient atmosphere. Lower cover member 510 is similarly mounted between baseplate 518 and a lower clamp ring 532 with locking bolts 534 and o-rings 536 and 538.

Process gas enters chamber 504 through a gas inlet port 540 and exits the chamber through an exit port 542. The pressure of the gas within the chamber is typically maintained by metering the gas flow out of exit port 542.

A susceptor 544 is provided within chamber 504 for supporting a wafer 546. Susceptor 544 includes a mounting fixture 545 that supports the susceptor within the chamber. Although FIG. 6 shows the susceptor being fixedly supported within the chamber, it is appreciated that the susceptor may be rotatably mounted to permit rotation of the susceptor during processing operations.

It is appreciated that the methods and apparatus of the present invention may be used for multiple wafer processing and single wafer processing. It is further understood that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. A reactor comprising a chamber wherein said chamber is defined at least partially by a central window portion having an inward bow defining a concave outside surface.

2. The reactor of claim 1 wherein said central window portion has a radius of curvature greater than 50 inches.

3. The reactor of claim 1 wherein said central window portion comprises clear fused silica quartz.

4. The reactor of claim 1 further comprising a flange portion secured to the periphery of said central window portion.

5. The reactor of claim 1 wherein said central window portion has a thickness between 0.1 and 0.2 inches.

6. A thermal reactor for processing a semiconductor wafer comprising:
    a wafer chamber for containing at least one semiconductor wafer during processing, said wafer chamber at least partially defined by a window portion having an inward bow defining a concave outside surface.

7. The thermal reactor of claim 6 wherein said window portion comprises clear fused silica quartz.

8. The thermal reactor of claim 6 wherein the inward bow of said window portion is spherical with a radius of curvature greater than 50 inches.

9. A reactor for processing semiconductor wafers at an elevated temperature in a processing gas at a pressure equal to or above atmospheric pressure, said reactor comprising:
    a reactor vessel having a wafer chamber for containing at least one semiconductor wafer during processing, and having a heating port through said reactor vessel to said chamber;
    radiant energy heating means outside of said reactor vessel for radiating energy through said heating port into said chamber to elevate the temperature of said wafer;
    gas means for introducing said processing gas into said chamber and for evacuating said processing gas from said chamber; and
    a cover member mounted over said heating port having a central window portion, said central window portion formed of a material that is generally transparent to the radiant energy from said heating means for passing said radiant energy into said chamber, said window portion having an inward bow defining a concave outside surface.

10. The reactor of claim 9 wherein said central window portion comprises clear fused silica quartz.

11. The reactor of claim 9 wherein the inward bow of said window portion is spherical with a radius of curvature greater than 50 inches.

12. A reactor for processing semiconductor wafers at an elevated temperature in a processing gas at a pressure above atmospheric pressure, said reactor comprising:
    a reactor vessel having a wafer chamber for containing at least one semiconductor wafer during processing, and having a heating port through said reactor vessel to said chamber;

radiant energy heating means outside of said reactor vessel for radiating energy through said heating port into said chamber to elevate the temperature of said wafer;

a first gas means for introducing said processing gas into said chamber;

a second gas means for evacuating said processing gas from said chamber, said second gas means having a flow restricting means for restricting the flow of said gas; and a cover member mounted over said heating port having a central window portion and a flange portion, said central window portion formed of a material that is generally transparent to the radiant energy from said heating means for passing said radiant energy into said chamber, said window portion having an inward bow defining a concave outside surface.

13. The reactor of claim 12 wherein said central window portion comprises clear fused silica quartz.

14. The reactor of claim 12 wherein the inward bow of said window portion is spherical with a radius of curvature greater than 50 inches.

15. The reactor of claim 12 wherein said flow restricting means comprises a throttle valve.

16. The reactor of claim 12 wherein said flow restricting means comprises an orifice.

* * * * *